(12) United States Patent
Gomez et al.

(10) Patent No.: US 11,631,431 B2
(45) Date of Patent: Apr. 18, 2023

(54) ANALOG OPTICAL LINK FOR A MOVEABLE ACTUATOR IN A DATA STORAGE SYSTEM

(71) Applicant: Seagate Technology LLC, Fremont, CA (US)

(72) Inventors: Kevin A. Gomez, Eden Prairie, MN (US); Aditya Jain, Minneapolis, MN (US); Anil J. Reddy, Minneapolis, MN (US); Todd Michael Lammers, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/856,321

(22) Filed: Jul. 1, 2022

(65) Prior Publication Data

US 2023/0005504 A1 Jan. 5, 2023

Related U.S. Application Data

(60) Provisional application No. 63/218,099, filed on Jul. 2, 2021.

(51) Int. Cl.
| | | |
|---|---|---|
| *G11B 13/04* | (2006.01) | |
| *G02F 1/21* | (2006.01) | |
| *G02F 1/01* | (2006.01) | |
| *H05K 1/02* | (2006.01) | |

(52) U.S. Cl.
CPC ............ *G11B 13/045* (2013.01); *G02F 1/011* (2013.01); *G02F 1/212* (2021.01); *H05K 1/028* (2013.01); *H05K 1/0274* (2013.01); *H05K 2201/10121* (2013.01)

(58) Field of Classification Search
CPC ....... G11B 13/045; G02F 1/011; G02F 1/212; H05K 1/0274; H05K 1/028; H05K 2201/10121
See application file for complete search history.

(56) References Cited

U.S. PATENT DOCUMENTS

| | | |
|---|---|---|
| 7,272,316 B2 | 9/2007 | Jung et al. |
| 7,907,334 B2 | 3/2011 | Gu et al. |
| 8,113,851 B2 | 2/2012 | Hamner et al. |
| 8,305,710 B2 | 11/2012 | Cho et al. |

(Continued)

*Primary Examiner* — Andrew Sasinowski
(74) *Attorney, Agent, or Firm* — Mueting Raasch Group

(57) ABSTRACT

Apparatus and method for transferring data in a data storage system, such as but not limited to a hard disc drive (HDD). An optical link is provided between an analog front end (AFE) of a data storage device controller circuit (SOC) and a preamplifier/driver circuit (preamp) mounted to a rotary actuator to transfer an analog domain signal. A selected component is extracted from the signal using a modulation element such as a micro-resonance ring (MRR) or a Mach-Zehnder Interferometer Modulation (MZM) device. The extracted component is forwarded to a processing circuit to facilitate a transfer of data between a local memory and a non-volatile memory (NVM). The optical link includes a flexible portion in a flex circuit affixed to the rotary actuator and which supports the preamp. Multiplexed read, write, and power control signals are concurrently transmitted via the optical link. The link can concurrently service multiple head-disc assemblies (HDAs).

20 Claims, 10 Drawing Sheets

(56) References Cited

U.S. PATENT DOCUMENTS

| | | | |
|---|---|---|---|
| 8,937,782 | B1 | 1/2015 | Dang et al. |
| 9,019,646 | B2 | 4/2015 | Rausch et al. |
| 9,197,352 | B2 | 11/2015 | Lam et al. |
| 9,202,499 | B2 | 12/2015 | Kiely et al. |
| 9,245,541 | B1 | 1/2016 | Trantham et al. |
| 9,298,024 | B2 | 3/2016 | Yamanaka |
| 9,557,223 | B2 | 1/2017 | Mazumder et al. |
| 9,746,747 | B2 | 8/2017 | Testa et al. |
| 9,875,758 | B1 | 1/2018 | Trantham et al. |
| 10,359,568 | B2 | 7/2019 | Hu |
| 2018/0267384 | A1* | 9/2018 | Padmaraju .............. G02F 1/225 |
| 2018/0356655 | A1* | 12/2018 | Welch .............. H04B 10/50595 |
| 2020/0110992 | A1* | 4/2020 | Hosseinzadeh ...... G06N 3/0445 |

* cited by examiner

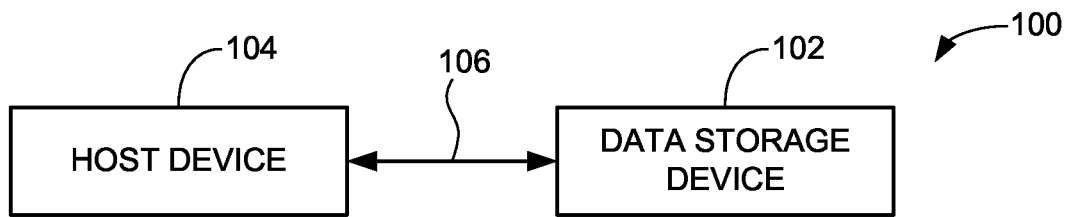
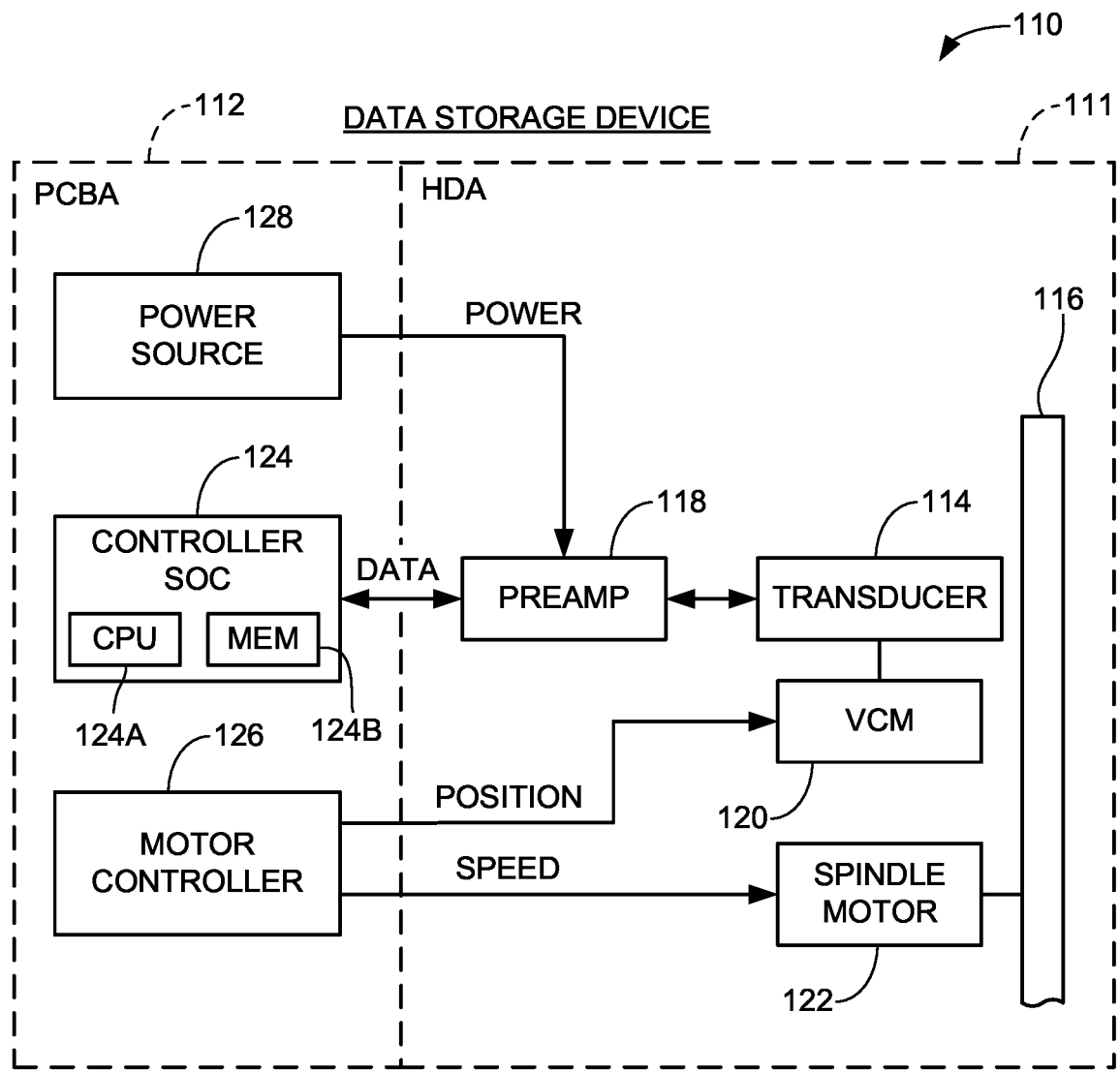
FIG. 1
FIG. 2

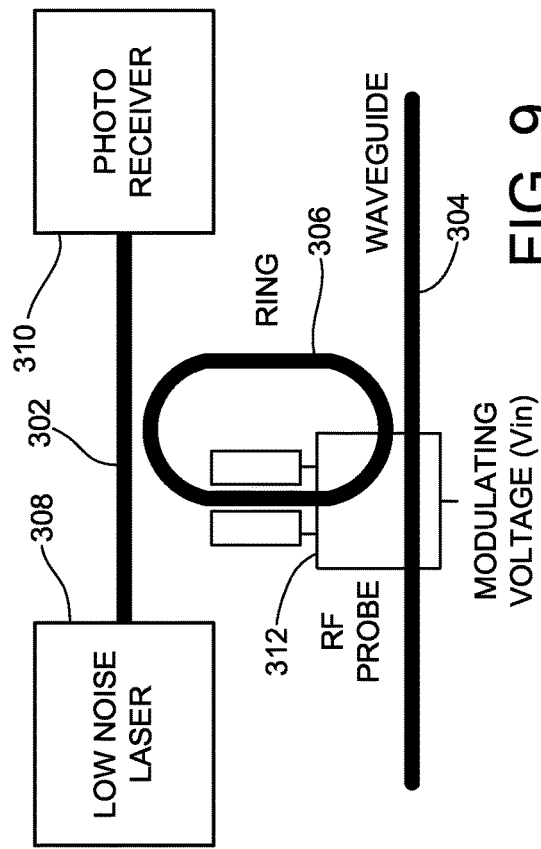
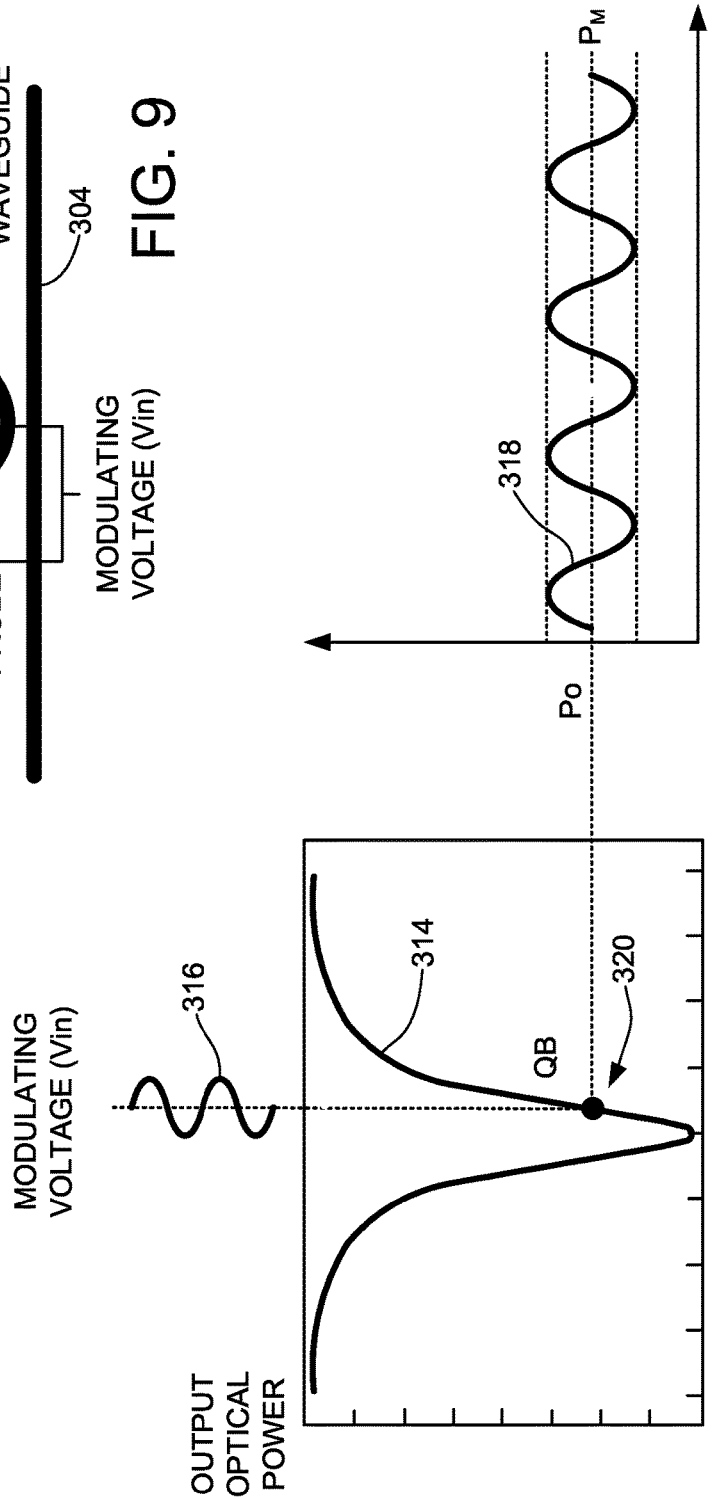
FIG. 9
FIG. 10

ANALOG OPTICAL LINK FOR A MOVEABLE ACTUATOR IN A DATA STORAGE SYSTEM

RELATED APPLICATION

The present application makes a claim of domestic priority under 35 U.S.C. 119(e) to U.S. Provisional Application No. 63/218,099 filed Jul. 2, 2021, the contents of which are hereby incorporated by reference.

SUMMARY

Various embodiments of the present disclosure are generally directed to an optical link for a data actuator, and methods of using the same.

Without limitation, in some embodiments an optical link is provided between an analog front end (AFE) of a data storage device controller circuit (SOC) and a preamplifier/driver circuit (preamp) mounted to a rotary actuator. A selected component is extracted from the signal using a modulation element, such as a micro-resonance ring (MRR) or a Mach-Zehnder Interferometer Modulation (MZM) device. The extracted component is forwarded to a processing circuit to facilitate a transfer of data between a local memory and a non-volatile memory (NVM). The optical link includes a flexible portion in a flex circuit affixed to the rotary actuator and which supports the preamp. Multiplexed read, write, and power control signals are concurrently transmitted via the optical link. The link can concurrently service multiple head-disc assemblies (HDAs).

These and other features that may characterize various embodiments can be understood in view of the following detailed discussion and the accompanying drawings.

BRIEF DESCRIPTION OF THE DRAWINGS

FIG. 1 provides a functional block representation of a data handling system with a data storage device constructed and operated in accordance with various embodiments.

FIG. 2 shows a block diagram representation of another data storage device constructed and operated in accordance with some embodiments.

FIG. 9 is a schematic representation of a modulation element characterized as a micro-resonance ring (MRR) in some embodiments.

FIG. 10 shows input/output response characteristics of the MRR of FIG. 9.

DETAILED DESCRIPTION

Figure 3:
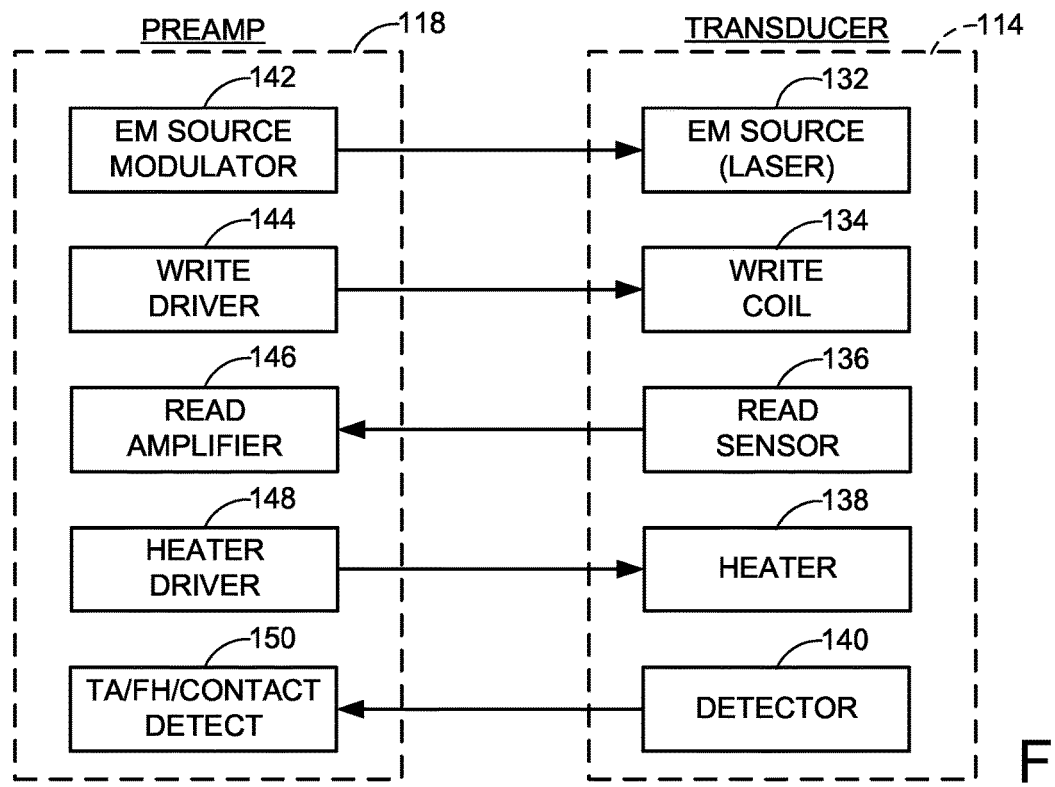
FIG. 3 shows aspects of the storage device of FIG. 2.

Various embodiments of the present disclosure are generally directed to systems and methods for active light transmission in a data storage environment.

Hard disc drives are a type of data storage device typically having a printed circuit board assembly (PCBA) affixed to a head-disc assembly (HDA). The PCBA has control electronics such as a system on chip (SOC) integrated circuit device to provide top level control of the storage device. The HDA may be in the form of a sealed enclosure housing a head-disc assembly (HSA) with arrays of data transducers (heads) and rotatable magnetic recording surfaces (discs) to store and retrieve user data. The transducers are located at the end of head-gimbal assemblies (HGAs) supported by a rotary actuator. Preamplifier/driver circuitry (preamps) are usually incorporated into the HSA in close proximity to the transducers to preserve signal integrity.

There are a number of limitations associated with current generation electrical signal and power systems in HDDs and other related types of devices. First, in mass storage data archival systems where one controller PCBA interconnects and controls a large number of HDAs, there are limitations associated with electrical connectivity due to the limited reach of the high-bandwidth signals over copper wire. Second, with the increasing numbers of heads being operated in parallel on modern HSAs, the preamp electronics can generate substantial heat which can affect the integrity of the high-bandwidth signals being transmitted and processed during HDD operation. Third, there remains an industry-wide desire to reduce energy consumption in storage devices, including the power used by preamp electronics.

One approach to address these and other limitations would be to use optical interconnects to address the limited reach of electrical connections. However, optical links operating in the digital domain require the use of expensive, high-speed, and high power consumption analog-to-digital and digital-to-analog converters (ADCs and DACs) and other complex circuitry in the preamp.

Various embodiments of the present disclosure are accordingly directed to a method and apparatus for providing efficient transmission of energy using light emission and detection techniques in a data storage environment. As explained below, a specially configured, analog domain optical link is established between an initiator device and a target device, such as but not limited to a PCBA and an HSA in an HDD.

The optical link is used to transfer energy in the form of an analog signal to support data transfer operations with a non-volatile memory (NVM). The analog signal can include multiplexed data, sensor, control and/or power signals. Modulation circuitry is incorporated into the optical link to implement compact, high bandwidth wavelength division multiplexed (WDM) optical transceivers. The modulation circuitry can take a variety of forms, including but not limited to micro-ring resonators (MRRs) and Mach-Zehnder Interferometer Modulation (MZM) devices.

The disclosed solution provides a number of advantages over the existing art. Conveying signals in the analog domain eliminates the need for ADCs and DACs, as the signals can be conveyed over optical links in their native format. As such, the various embodiments can reduce pre-amp power consumption levels as compared to those experienced by existing copper (metal) wire connected preamps.

Optical links are capable of very high bandwidths that are not achievable with current generation metal connection paths. For example, current generation metal interconnects are generally limited to transmission rates in the 5-6 GHz ($10^{12}$ Hz) range. This range is not scalable to higher levels owing to limitations associated with link mechanical cross section, flexibility requirements, drive height constraints and other areal considerations. It is also not feasible to simultaneously convey both read and write signals along the same metal conductors due to crosstalk.

By contrast, analog optical links can accommodate bandwidths that are orders of magnitude greater than the fastest metal interconnections. Using frequency multiplexing techniques allow coincident read and write data streams without SNR (signal-to-noise ratio) degradation, as well as the bundling of SIF (special interface format) control data in the same links.

The SOC to preamp links will be scalable from current to future bandwidth requirements without occupying more space, unlike conventional configurations. Existing bulkhead connectors used to accommodate conventional metal interconnections are limited in the total number of wires/pins that can extend through the HDA base deck to maintain access and signal isolation levels; using larger bulkhead connectors to increase pin count also increases sealing concerns and costs. By contrast, the narrow cross section, elasticity, and near-zero losses within optical fiber links also offer more flexibility in the routing of the high bandwidth link. Pin counts and sizes of optical link bulkhead connectors are reduced, simplifying interconnects and housing seal considerations.

In accordance with various embodiments presented below, an optical waveguide transmits electromagnetic radiation in the form of light between PIC (photonic IC, transceivers) on the main PCBA and the HDA. A laser source on the PCBA presents the light into the waveguide which is designed to transmit CW (continuous wave) light at the laser wavelength. Tuning of the corresponding resonator will determine which reader or writer in the stack is active. In one embodiment, a single reader or writer is accessed at any instance in time. As such, a single wavelength is sufficient to carry the single data stream. In other embodiments, multiple readers and/or writers can be simultaneously accessed, as well as other active elements (e.g., sensors, heaters, laser diodes, etc.).

During writing operations, the SOC presents an electrical signal to the MRR or MZM modulator in the PIC. The amplitude modulation of the electrical voltage is the data to be stored. The voltage modulation at the MRR or the MZM alters the optical power output of the modulator; in this manner, the optical output power of the modulator carries the data to be stored. A photodetector integrated with the writer portion of the pre-amp provides a measure of the modulating optical power signal.

The same waveguide and laser can be used for reading. The read signal from the preamp is a voltage acting upon the optical modulator (MRR or MZM), which in turn modulates the optical power output of the modulator. This modulated light power is sensed by the photodetector (PD) at the PIC on the PCBA. The PD output is in the electrical domain; its amplitude corresponds to the reader signal.

In the case of simultaneous read and/or write (multiple heads reading data simultaneously, or simultaneous writing/reading by the same head), multiple wavelengths may be used on the same fiber, each carrying data for a different transducer element. A light source capable of producing all of these wavelengths will be required (e.g., tunable laser, multiwavelength laser). Micro rings can be tuned to a particular wavelength and the filtering and modulation can be achieved via the same device; no additional structures are required in that there can be a wavelength associated with each read/write channel, and the associated micro ring correspondingly tuned to that wavelength.

For MZM-based implementations, modulation and detection can be separated. For signal modulation (writing) an Arrayed Waveguide Grating (AWG) can be used at the input of the multiwavelength laser. AWGs enable low-loss coupling of multiple wavelengths into a single waveguide. A 1×N AWG separates multiplexed wavelengths into N different channels. Each separated wavelength is modulated via an MZM, which is connected to each output of the AWG. For detection (reading), a similar approach is used, only in reverse: an AWG multiplexes the optical data exiting the reader-induced excitation of the MZM modulator, and the resulting signal is injected into the single waveguide.

Additional aspects of various embodiments can include temperature control compensation. Generally, MRRs are more sensitive to temperature as compared to MZMs, but closed-loop detection and compensation techniques can be utilized in both cases to maintain appropriate transfer performance.

To boost the gain of the RF analog link, a DFB (distributed feedback) laser with high power output levels such as on the order of around 60 mW to 100 mW may be implemented. The optical link material (waveguide) should have a high bandgap to prevent two photon absorption at high power. A suitable waveguide material is silicon nitride (SiN). Since the small signal modulation will likely be implemented in silicon, light will be split into multiple rings and the final modulated output combined and sent to the output waveguide. Noise in the system can be reduced by either using a high laser input or a pre-amplifier at the input of the respective modulation circuits.

When MZMs are used, their nonlinear response can be modeled as a sum of Bessel functions. Linearization can be achieved by some combination of modulator geometry optimization, material doping optimization, and via pre-distortion of the signal input to dynamically compensate for MZM nonlinearity. Geometrical and doping optimization is less power hungry but may require prior knowledge of the device nonlinearity, and is difficult to tune dynamically once the device has been fabricated. Electronic pre-distortion can require significant power levels (e.g., greater than 100 mW/element), but can be tuned to linearize the response substantially (e.g., levels greater than 10 dB cancellation in inter modulation distortion).

The optical links can be used for a number of different types of signals between an HSA and an SOC, including but not limited to data write, data read, laser control, heater control, sensor outputs, power, etc. Stand-alone storage device and multi-device array configurations are contemplated.

These and other features and advantages of various embodiments can be understood beginning with a review of FIG. 1 which provides a simplified functional representation of a data handling system 100. The system 100 features a data storage device 102 coupled to a host (client) device 104 via a suitable interface 106. The respective storage device 102 and the host 104 can take any number of forms.

In some embodiments, the storage device 102 provides non-volatile storage of data from the host 104 in a main NVM store. The storage device 102 can be a hard disc drive (HDD), a hybrid drive, an optical drive, a magneto-optical drive, a solid-state drive (SSD), a storage array of multiple devices, a data server, or some other form of data storage.

The host 104 can be a network accessible computing device such as a desktop computer, a server, a drive array, a portable electronic device, a smart phone, a laptop, a tablet, a video recorder, a gaming system, etc. The storage device 102 may be incorporated into the host 104, or may be connected to the host locally or via a network to provide data storage capabilities for the host 104. The host device 104 can be a local server in a network, or an end user device with various intermediate devices (not shown) such as routers, servers, switches, etc. disposed along the path between the devices 102, 104.

Communications between the host 104 and the storage device 102 can be carried out using any number of different interfaces 106, including but not limited to PCIe, ATA, SATA, ASA, fibre wire, fibre channel, wireless interconnects, etc. The system 100 can be operated in accordance with various industry standard protocols, such as NVMe (Non-Volatile Memory Express), CXL (Compute Express Link), etc. The system 100 may be incorporated into a larger computer network, including but not limited to a cloud computing network, the Internet, etc.

In order to provide a detailed explanation of operative features of various embodiments set forth by this disclosure, it will be helpful to first provide a detailed overview of various characteristics of operational environments in which the various embodiments can be advantageously practiced, including the various types of signals that can be advantageously transmitted and detected. It will be appreciated that the disclosed subject matter is not necessarily limited to these environments.

Beginning with FIG. 2, a data storage device 110 corresponding to the storage device 102 of FIG. 1 is characterized as an HDD formed from a head-disc assembly (HDA) 111 and a printed circuit board assembly (PCBA) 112. The HDA 111 generally comprises a sealed enclosure which houses various elements such as a transducer 114, a rotatable data recording medium (disc) 116, preamplifier/driver (preamp) 118, a voice coil motor (VCM) 120 and a spindle motor 122. Other elements can be used as desired. While only a single transducer 114 and medium 116 are shown, it will be appreciated that multiple transducers and media can be incorporated into the HDA 111.

The PCBA 112 includes a multi-layer printed circuit board (PCB) substrate that supports various electrical control circuitry for the HDA 111 including a main controller 124, a motor controller 126 and a power source circuit 128. Other circuitry elements can be provided as required, but such have been omitted for simplicity of illustration.

The controller 124 is a system on chip (SOC) integrated circuit device that incorporates one or more hardware based or programmable processors. The hardware processors can be formed of gate logic or other hardwired circuit elements. The programmable processors, such as CPU 124A, execute associated programming stored in a local memory, such as memory 124B, to carry out the various functions described herein.

The motor controller 126 similarly incorporates one or more hardware or programmable processors, and can form a portion of the SOC 124 or be a standalone circuit. The power source 126 includes various transformers, relays, switches, regulators, batteries and other elements to supply electrical power for use by the system. At least some aspects of the power source can also be incorporated into the SOC 124.

The SOC 124 provides data and control signals to the preamp 118 for the writing of data to, and the reading of data from, the medium 116. The motor controller 126 provides drive currents to the respective VCM 120 and spindle motor 122. The VCM 120 positions the transducer(s) 114 adjacent tracks defined on the medium 116 using a closed loop servo control system. The spindle motor 122 maintains the media at a nominally constant rotational speed, such as on the order of around 10,000 rpm (revolutions per minute) during operation.

The power source 128 supplies various voltages and/or currents to the preamp 118 for use by the transducer 114 and other elements of the system. While not limiting, voltages can include both positive and negative regulated voltages such as +3.3 v, +5V, −5V, +12V, etc. The power source may be adjustable to provide tuned power inputs at selected levels as required. In some cases, local power source circuitry may be incorporated into the preamp 118 to satisfy local power requirements. This local power source circuitry may receive input power from an upstream source such as the power source 128 on the PCBA.

FIG. 3 shows an exemplary construction of the data storage device 110 to illustrate interaction between the transducer 114 and the preamp 118 in some embodiments. The transducer 114 includes an electromagnetic source 132, a write coil 134, a read sensor 136, a heater 138 and a detector (sensor) 140. Other elements can be incorporated into the transducer, so that FIG. 3 is merely illustrative and not limiting.

The electromagnetic source 132 generates electromagnetic energy in a thermally assisted magnetic recording system, such as a heat-assisted magnetic recording (HAMR) system or a microwave-assisted magnetic recording (MAMR) system. These and other related systems provide localized heating to lower the magnetic coercivity of the medium during write operations.

The write coil 134 (writer) generates magnetic fields to write data to the medium in the form of magnetic flux transitions, and may take the form of a perpendicular magnetic recording element. The read sensor 136 (reader) is adapted for recovering recorded data from the magnetic recording medium and may take a magneto-resistive (MR) construction.

The heater 138 may be a resistive element that maintains an associated element (e.g., laser, writer, reader) at a desired operational temperature. Detectors such as 140 can be variously configured to detect thermal asperities (TAs), fly height (FH) and/or head/disc contact between the transducer 114 and the magnetic recording medium 116.

The preamp 118 includes various driver and amplifier circuitry to interface with the foregoing elements of the transducer 114. This circuitry includes an EM source driver circuit 142 for driving the electromagnetic source 132, a differential trans-conductance writer driver circuit 144 for driving the writer coil 134 with a programmable current level, a read amplifier 146 for processing readback signals from the read sensor 136, a heater driver for supplying electrical power (e.g., voltage/current) to the heater(s) 138, and a TA/FH/contact detection circuit 150 for processing thermal asperity, fly height and/or disc contact detection signals from the detector(s) 140.

Other preamp configurations are envisioned, including configurations that omit one or more of these elements, configurations that use multiple ones of these elements (e.g., a multi-read sensor transducer, etc.), configurations that include additional elements such as heaters or other fly height adjustment mechanisms, microactuators, photodetectors, fly height adjustment elements, etc. Suitable electrical power is applied to the various preamp components and transducer components from the power source 128.

Figure 4:
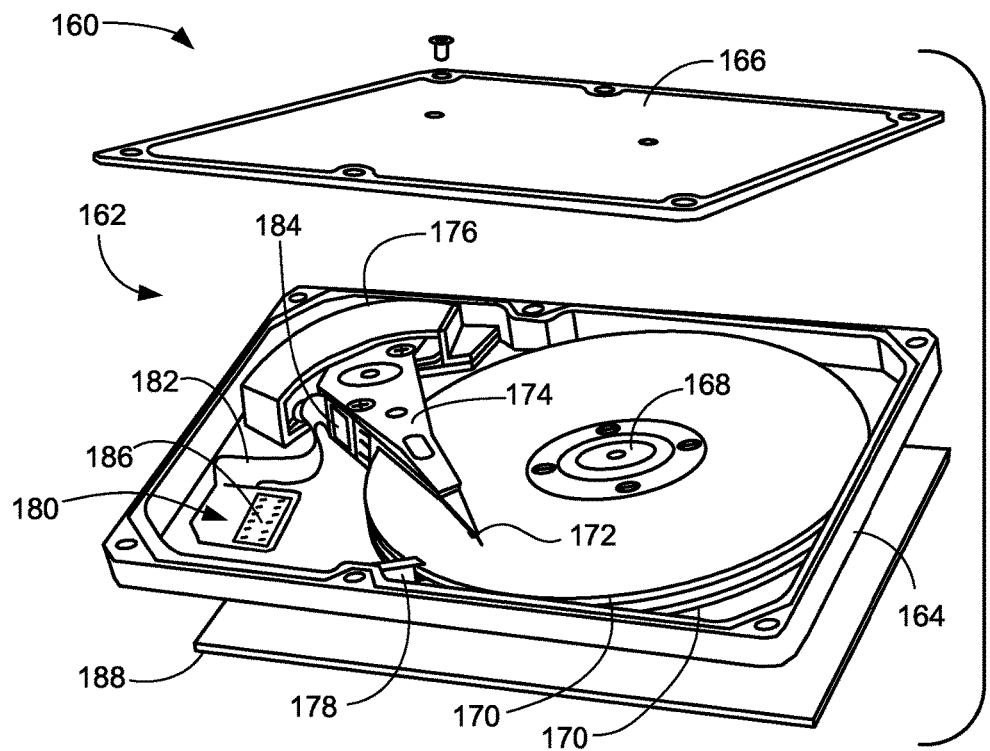
FIG. 4 is an exploded isometric view of another data storage device constructed and operated in accordance with some embodiments.

FIG. 4 shows the physical configuration of another data storage device 160 in accordance with various embodiments. The storage device 160 is similar to the storage devices 102, 110 discussed above and is characterized as an HDD. An exploded view is provided to illustrate various elements of interest.

The HDD 160 may be characterized as a 3½ inch form factor drive, a 2½ inch form factor drive, or some other form factor drive. The HDD 160 may be alternatively characterized as a hybrid drive so that the main memory includes both rotatable magnetic recording media and solid-state media such as an array of flash memory or some other form of semiconductor-based memory.

The HDD 160 in FIG. 4 includes an HDA 162 having a base deck 164 and top cover 166 which cooperate to form a sealed, environmentally controlled interior environment for the HDA. A spindle motor 168 is mounted to the base deck 164 to rotate a stack of magnetic recording media (discs) 170 at a selected operational speed. Data read/write transducers (heads) 172 are controllably advanced across recording surfaces of the media 170 by way of a rotatable actuator 174 and a VCM 176. The HDD 160 is a low-profile storage device with two (2) discs and four (4) corresponding transducers.

A load/unload ramp structure 178 is positioned adjacent an outermost diameter of the media 170 to park the transducers 172 when the HDD is deactivated. A flex circuit assembly 180 includes a flex circuit 182, preamp 184 and a bulkhead connector 186 to facilitate the transfer of data and control signals between the transducers 172 and HDD electronics on an externally mounted PCBA 188. For reference, the transducers 172, actuator 174, coil of the VCM 176, flex circuit 182, preamp 184 and bulkhead connector attachment 186 are collectively referred to herein as a head-stack assembly (HSA).

Figure 5:
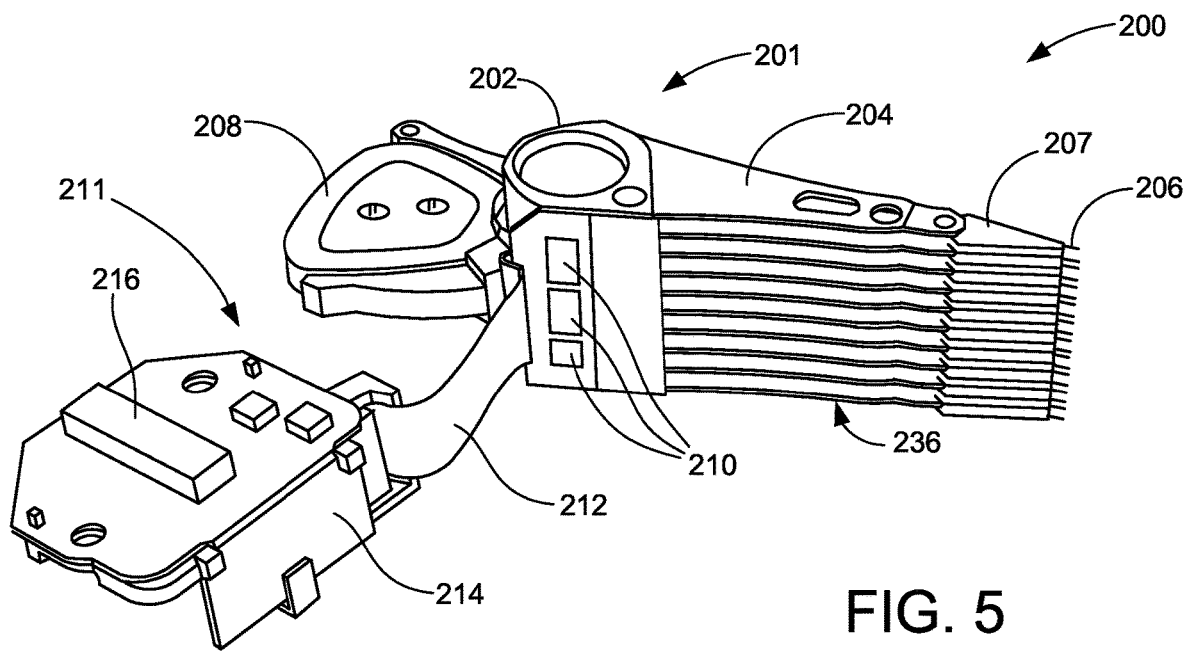
FIG. 5 depicts an actuator assembly of yet another data storage device constructed and operated in accordance with some embodiments.

FIG. 5 shows aspects of another data storage device 200 similar to the storage devices 102, 110 and 160 discussed above. As before, the storage device 200 may be an HDD or hybrid device. The device 200 is a high-capacity storage device with ten (10) storage discs (not separately shown) having twenty (20) recording surfaces and twenty (20) corresponding transducers. Other arrangements can be used.

An HSA for the storage device 200 is denoted at 201. The HSA 201 includes a rotatable actuator 202 which is pivotally mounted for access to the various disc recording surfaces in the device 200. The actuator 202 includes actuator arms 204 and distal read/write transducers (heads) 206 supported by head-gimbal assemblies (HGAs) 207. The transducers 206 are controllably positioned adjacent tracks defined on the recording surfaces via a coil 208 of a VCM. Preamplifier/driver (preamp) circuits 210 are mounted to a side of the actuator 202.

A flex circuit assembly 211 includes a flex circuit 212 that facilitates transfer of power, data and control signals between the preamps 210 and a bulkhead engagement assembly 214. As shown in FIG. 4, the bulkhead engagement assembly 214 facilitates, via a bulkhead connector 216, electrical communication between the actuator 202 and external control circuitry on an external PCBA.

The flex circuit 212 uses one or more optical links, such as in the form of optical fibers, to carry out these communication transfers. Similar optical links are utilized in each of the other storage devices 102, 110 and 160 discussed above.

Figure 6:
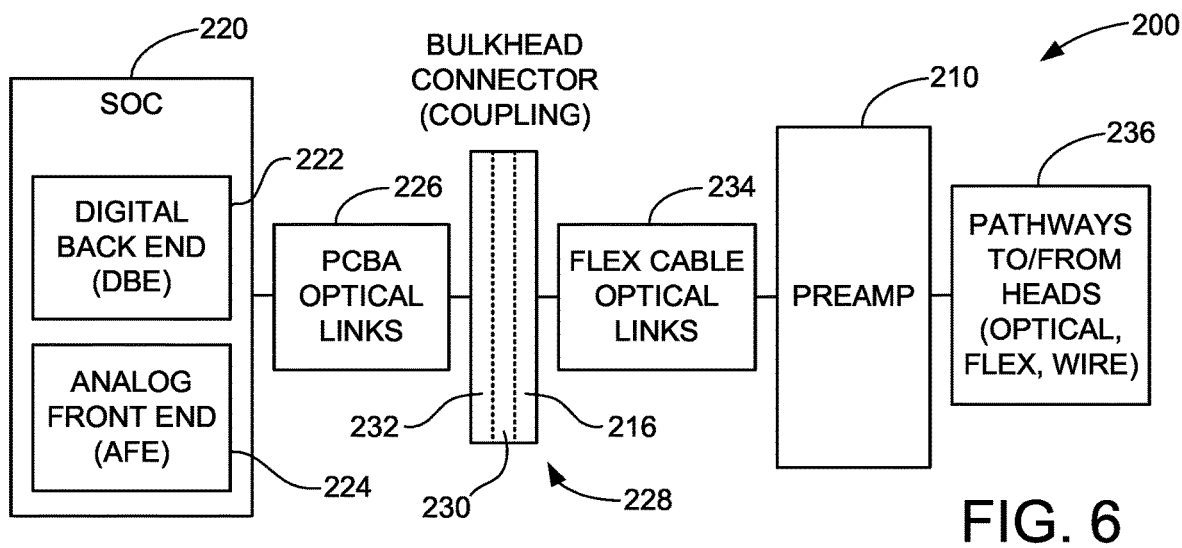
FIG. 6 shows an optical link path of the storage device of FIG. 5.

FIG. 6 shows aspects of the storage device 200 of FIG. 5 in some embodiments. The device 200 includes an SOC 220 with a digital back end (DBE) circuit 222 and an analog front end (AFE) circuit 224. The DBE 222 provides processing of data and control signals in the digital domain. The AFE 224 transforms these signals to the analog domain for communications to and from the actuator 202.

A set of PCBA optical links 226 extend from the AFE 224 to a bulkhead connector assembly 228. The PCBA optical links 226 may be formed using PCB masking and layering techniques to embed the links as rigid waveguides that extend along or in the underlying PCB to which the SOC 220 is mounted.

The bulkhead connector assembly 228 can take a number of forms depending on the requirements of a given application. In some cases, a three-piece connector arrangement is used. In this arrangement, an intermediate connector 230 is rigidly affixed to and extends through a corresponding aperture in an HDA base deck 230A (see FIGS. 4 and 6A).

A first mating connector 232 is mounted to a PCBA 232A and engages an exterior side of the intermediate connector 230. This allows the PCBA 232A to be removably attached to the exterior of the base deck. The bulkhead connector 216 in FIG. 5 serves as a second mating connector to engage an opposing, interior side of the intermediate connector 230 to allow the actuator 202 to be removably mounted within the interior of the base deck 230A.

Figure 6A:
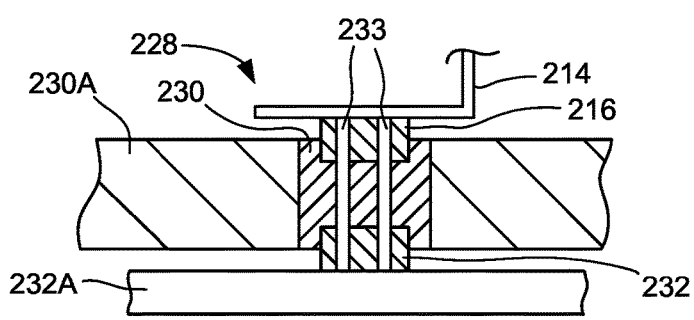
FIG. 6A shows aspects of a connector arrangement of FIG. 6.

As depicted at 233 in FIG. 6A, optical couplings are provided in and extend through the bulkhead connector assembly 228 to interconnect the PCBA optical links 226 with a corresponding set of flex cable optical links 234 (FIG. 6). The flex cable optical links 234 are flexible waveguides such as glass fibers or other flexible waveguide material and extend along or in the flex circuit cable 212 to each preamp 210.

Conductors 236 provide pathways that interconnect the preamps 210 and transducers 206. The conductors 236 lie along the sides or facing surfaces of the actuator arms 204 and HGAs 207 (FIG. 5). The conductors can take a variety of forms including metal traces on flex circuits, twisted pairs of metal wires, optical waveguides, etc.

Figure 7:
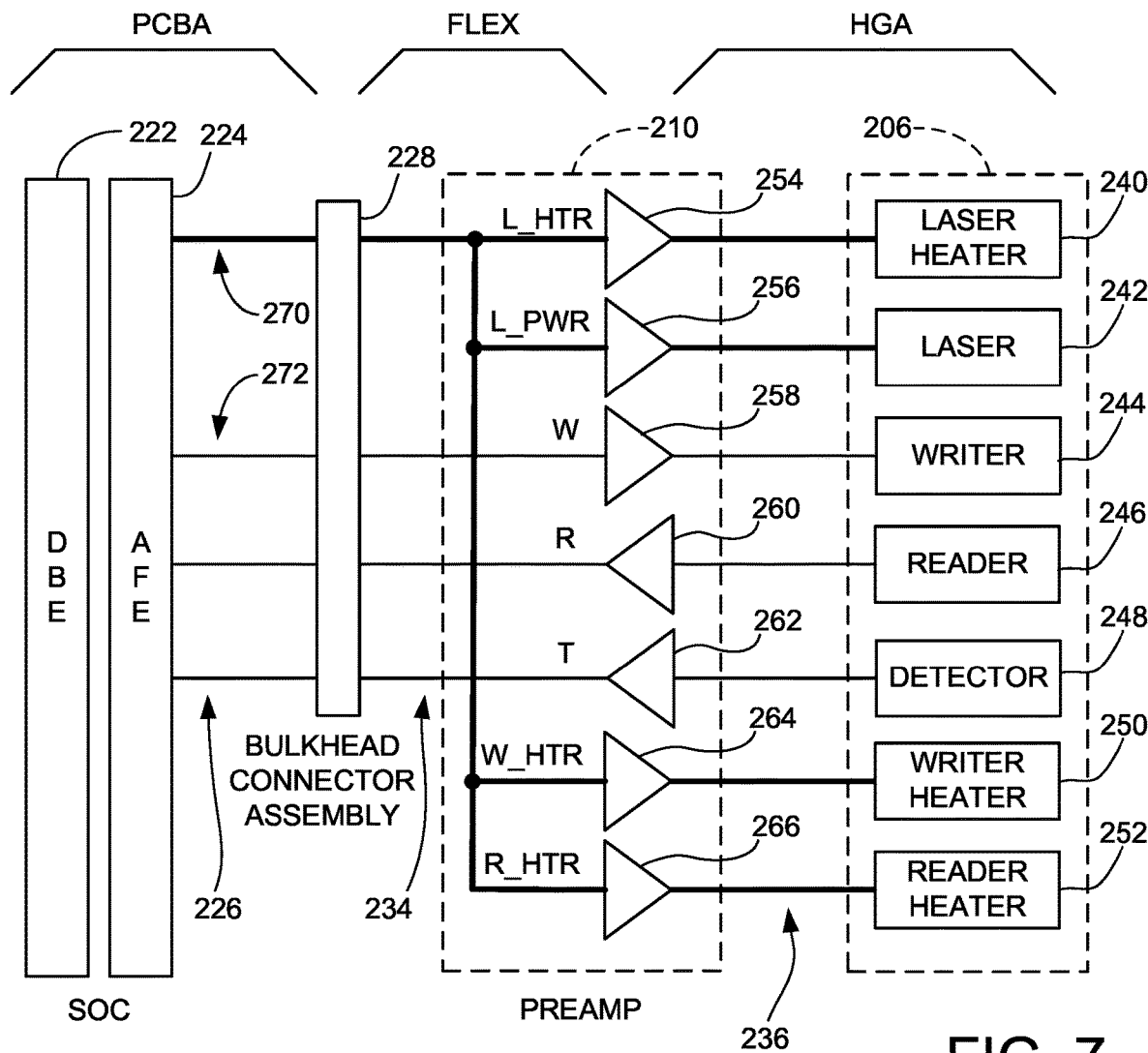
FIG. 7 shows aspects of the storage device of FIGS. 5-6.

FIG. 7 is a schematic diagram of further aspects of the storage device 200. Respective PCBA, flex circuit and HGA sections are denoted for a selected preamp/transducer pair.

In FIG. 7, the transducer 206 includes various elements discussed above including a laser heater 240, laser 242, writer 244, reader 246, detector 248, writer heater 250 and reader heater 252. These elements are respectively coupled to various circuits of the preamp 210 including a laser heater (L_HTR) driver 254, a laser power (L_PWR) driver 256, a write (W) driver 258, a read (R) amplifier 260, a detector (T) amplifier 262, a write heater (W_HTR) 264, and a read heater (R_HTR) 266. Some signals such as the reader and writer signals may be arranged as differential pairs.

The optical links 226, 234 and 236 include control power conduits 270 which provide control signals to the respective laser heater driver 254, laser power driver 256, write heater driver 264 and read heater driver 266. These control signals modulate the operation of the respective elements; for example, the L_HTR input to driver 254 controls the application of power to the associated heater element 240 using power from appropriate power circuitry at the PCBA or preamp level. Hence, while the conduits 270 are viewed as passing modulation control signals, it will be understood that the direct transmission of power via optical link is also contemplated in other embodiments.

The optical links 226, 234 further include data conduits 272 which transmit data, sense and/or control signals associated with the write driver 258, read amplifier 260 and detector amplifier 262. Depending on configuration, the conduits 270, 272 can be respectively configured to handle multiplexed, high frequency analog data/control signals of multiple gigahertz.

To this end, various embodiments of the present disclosure use modulation circuitry to implement compact, high bandwidth wavelength division multiplexed (WDM) optical transfers in the analog domain. As discussed above, the modulation circuitry can take various forms, including micro-ring resonator (MRR) and Mach-Zehnder Interferometer-based modulation (MZM) elements.

Figure 8:
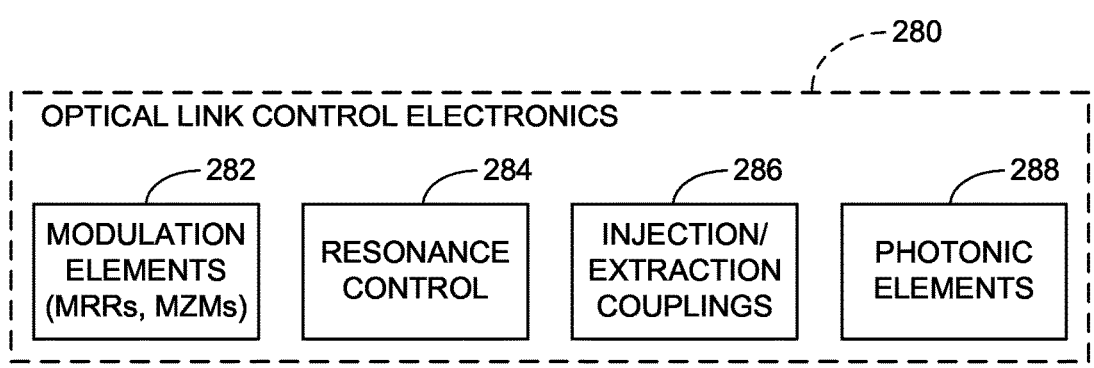
FIG. 8 shows aspects of optical link control electronics used in FIG. 7 in some embodiments.

As shown in FIG. 8, optical link control electronics 280 will be arrayed at one or both ends of the optical link, including in the AFE 224 and/or the preamp 210, depending on the type of signal being transmitted and modulation scheme employed.

FIG. 8 shows the electronics 280 to include an array of modulation elements 282, resonance control circuitry 284, injection/extraction couplings 286 and photonic elements 288, all of which interact with the optical link to inject and extract components of the transmitted analog signal. Other types of circuitry can be utilized as well, such as data buffers, multiplexers, voltage selection circuitry, etc.

The modulation elements can include MRRs and/or MZMs, and the resonance control circuitry acts upon these modulation elements to alter waveguide characteristics. The couplings provide physical interfaces to and from the waveguides. The photonic elements perform electric-photonic conversions (e.g. electrical to light and vice versa) and can take various forms such as photonic integrated circuits (PICs), photo detectors (PDs), photonic transceivers (PTRs), etc.

The MRRs utilize one or more extents of waveguides that pass adjacent a ring waveguide. Establishing resonance with the ring will cause a transfer from a first (IN) waveguide to a second (DROP) waveguide, while all other wavelengths will continue along a third (THRU) waveguide that extends from the IN waveguide. Other MRR arrangements can be used.

The native resonance characteristics of a given ring will depend at least in part upon the length of the ring. In various embodiments presented herein, the waveguide transmission gain characteristics are specifically controlled at the edge of resonance using the resonance control of each ring as an input.

To this end, FIG. 9 shows a schematic representation of an MRR-based modulation circuit 300 incorporated into the various storage devices disclosed herein in some embodiments. The circuit 300 includes first and second waveguides 302, 304 with an intervening ring 306. A low noise laser 308 and a photo receiver (PD) 310 are coupled to the first waveguide 302. An RF probe 312 modulates the modulation wavelength (modulation frequency) of the ring 306 to selectively change the resonance characteristics of the ring to enable transfers of signals between the waveguides 302, 304.

FIG. 10 shows a transfer function response curve 314 of the ring 306. The input Vin signal 316 detunes the ring's resonance, thereby reducing the power transmitting through the straight waveguide above it. The corresponding change in optical power output is shown at 318 which represents the analog output of the modulator. If two single frequency (RF/microwave) tones are injected into the modulator, some amount of intermodulation distortion is always present. Intermodulation can be reduced by biasing the modulators at a special point 320 along the transfer function referred to as the Quadrature Bias (QB) point.

Figure 11:
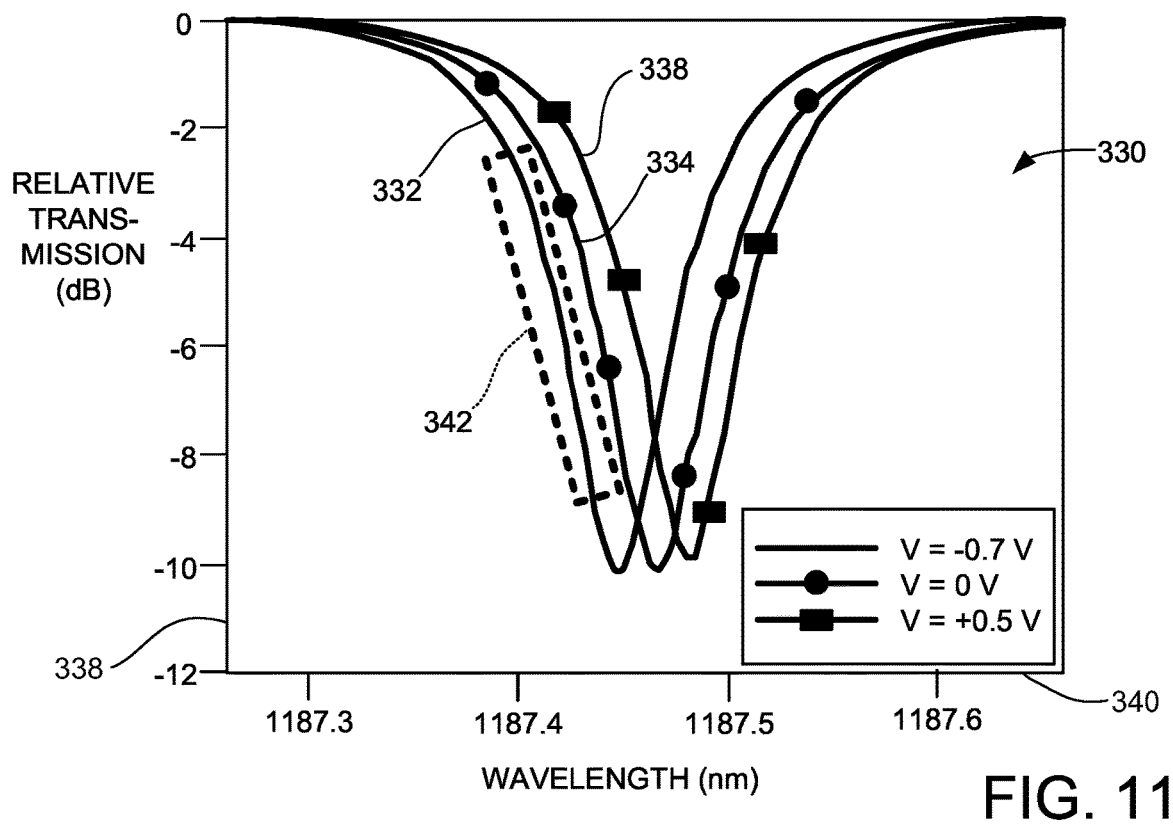
FIG. 11 graphically illustrates modulation of different MRRs.

FIG. 11 shows a set of response curves 330 to illustrate MRR transmission response vs resonance tuning point. Resonance tuning is via ring charge carrier density modulation (not heating) with a bandwidth capability in excess of 5 GHz. The curves 330 include first, second and third curves 332, 334 and 336 each for a different MRR. The curves are plotted against a relative transmission gain (−dB) y-axis 338 and a wavelength (nanometers, nm) x-axis 340. Modulation is provided along an edge-of-resonance zone 342. Each curve has a similar respective zone.

Figure 12:
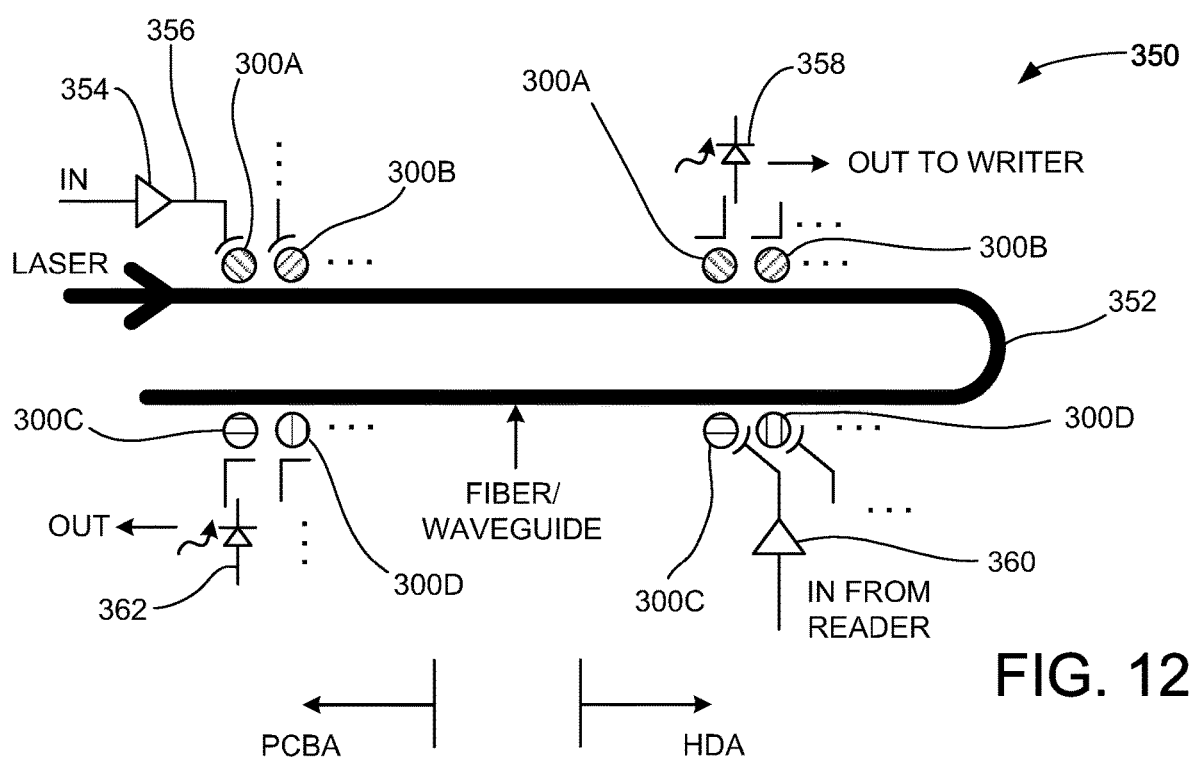
FIG. 12 is a schematic diagram for a data optical link system in accordance with some embodiments.

FIG. 12 shows an exemplary optical link system 350 for the concurrent transmission of analog domain, optical write and read signals in accordance with various embodiments. The system represents circuitry present in each of the various storage devices 102, 110, 160, 200 in different embodiments. Other arrangements can be used. In this embodiment, pairs of MRRs are used at each end of a waveguide transmission path 352. The pairs are denoted as 300A/300A, 300B/300B, 300C/300C and 300D/300D. Each pair of MRRs is associated with a different operative element; in FIG. 12, the pairs 300A/300A and 300B/300B are coupled to write transducers and the pairs 300C/300C and 300D/300D are coupled to read transducers.

The MRRs support a write operation to write data using a first selected transducer in the device associated with the pair 300A/300A. To this end, a modulation coupling 354 and waveguide 356 are operated to inject an input analog write current signal to a first end of the path 352. The signal is extracted at a second end of the path 352 and processed by extraction coupling and photo detector 358 to forward the write signal to the selected writer. Each of the remaining writers has its own pair of MRRs and is similarly accessed.

Read operations are carried out in a similar fashion and can be performed while write signals are being concurrently transferred in the same optical link. To read data from a second selected transducer associated with MRR pair 300C/300C, read signals are injected using coupling/driver 360 and extracted using coupling/PD 362 to transfer an analog read signal obtained from the read sensor.

The MZMs are interferometric structures formed from a material with a strong electro-optic effect (e.g., LiNbO3, GaAs, InP, etc.). A splitter arrangement is used to provide two parallel arms, or segments. Applying electric fields to the arms changes the optical path lengths resulting in phase modulation. Combining two arms with different phase modulation converts phase modulation into intensity modulation.

Figure 13:
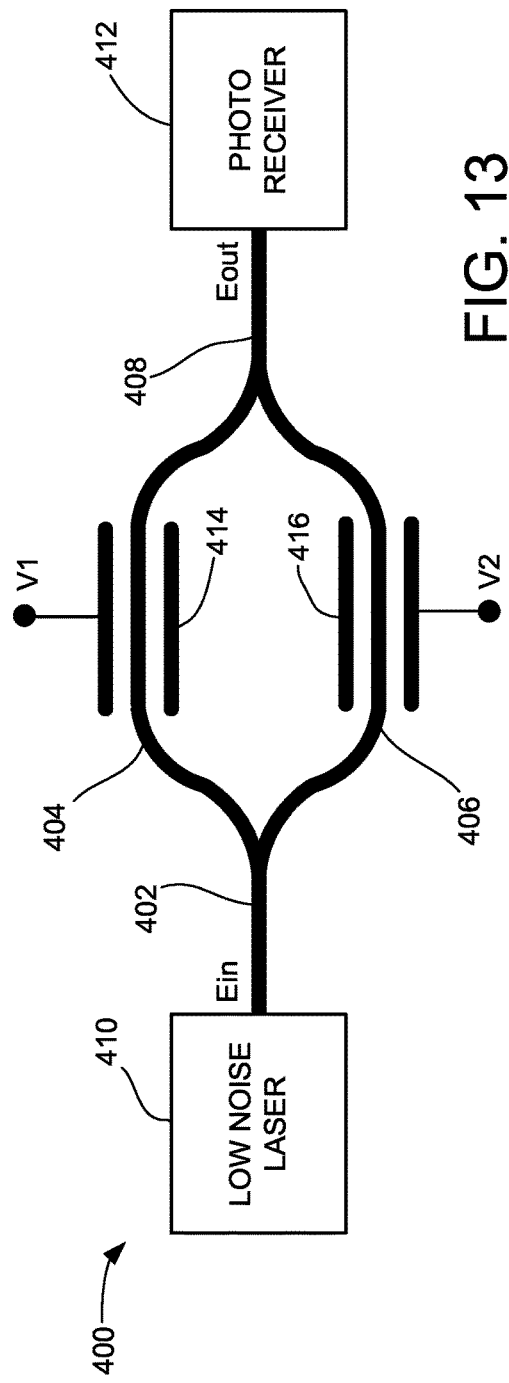
FIG. 13 is a schematic representation of a modulation element characterized as a Mach-Zehnder Interferometer Modulation (MZM) device in further embodiments.

An exemplary MZM-based modulation circuit is shown at 400 in FIG. 13. An optical waveguide includes input segment 402, parallel segments 404, 406, and output segment 408. These are bounded by an input low noise laser 410 and an output photo receiver 412. The respective segments 404, 406 have associated control elements 414, 416 to which modulation voltages V1, V2 can be applied. The input signal is denoted as Ein, and the output signal is denoted as Eout.

Figure 14:
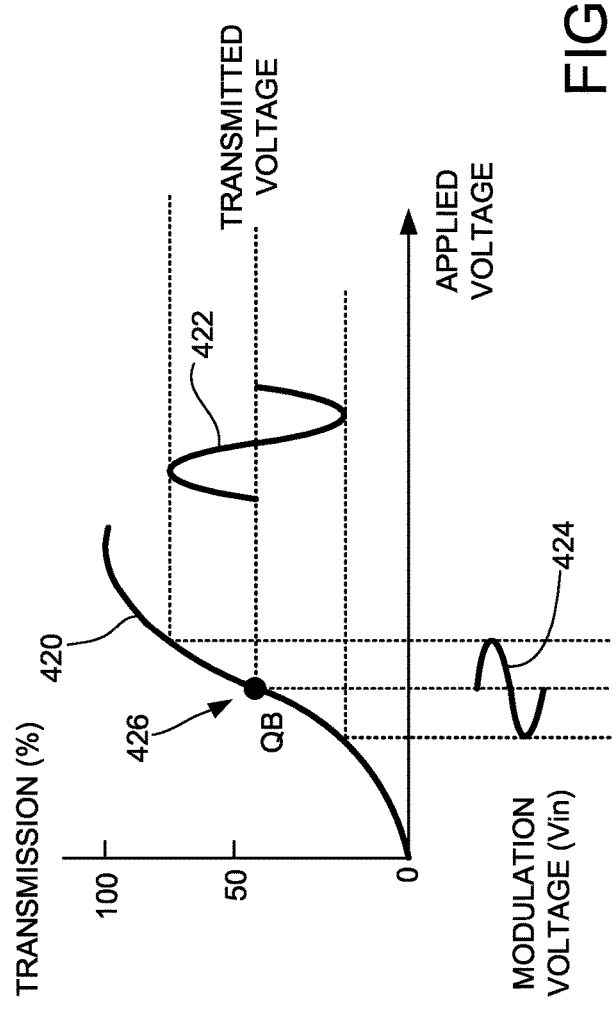
FIG. 14 shows input/output response characteristics of the MZM of FIG. 13.

The optical input Ein is split into the upper and lower modulator segments 404, 406 and are phase modulated with two phase shifters driven by the electrical signals $V_1$ and $V_2$ and then recombined into the optical output Eout. This alters the transmission power through the MZM 400. FIG. 14 shows transfer function response curve 420, which takes a sinusoidal based form. Output signal 422 in the x-axis direction is passed responsive to modulated input signal 424 (y-axis direction). As before, a QB point is shown at 426.

Figure 15:
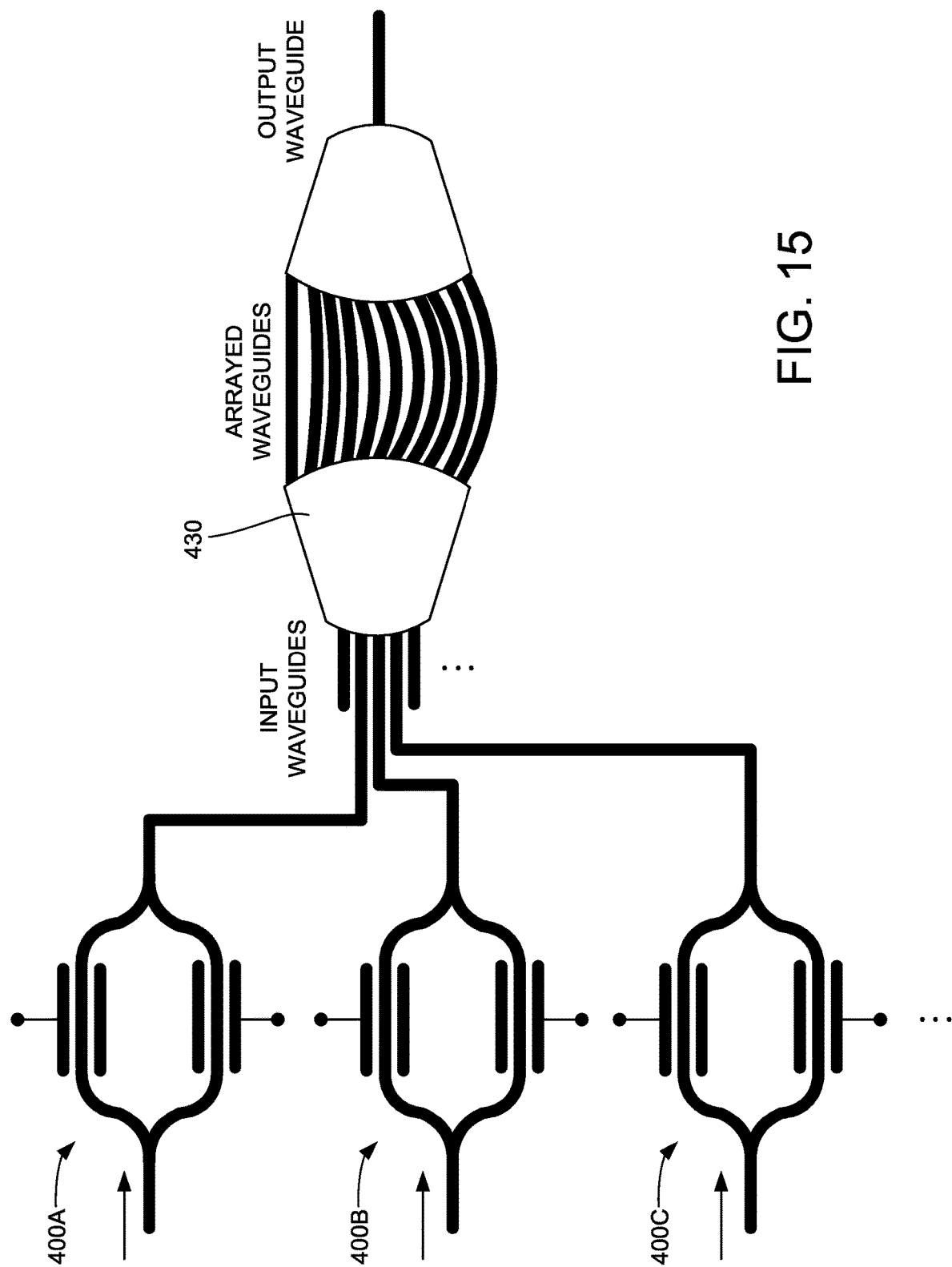
FIG. 15 shows a number of MZMs with selection circuitry in the form of an arrayed waveguide grating (AWG) device in some embodiments.

For MZMs, electrical data can be encoded into optical signal on an output waveguide via use of an arrayed waveguide grating (AWG), as represented at 430 in FIG. 15. The electrical data from individual transducer elements drives the voltage in branches of individual MZMs 400A, 400B, 400C, etc. associated with that transducer element. Different wavelength light passes through each of the MZMs. The resulting modulated optical signal passes through the AWG 430 in order to couple all of the multi-wavelength light into a single output waveguide with low loss. In this implementation, the C-band (centered at 1550 nm) may be used to carry the optical signals. AWGs such as 430 can be used as either multiplexers or demultiplexers depending on location in the system.

Figure 16:
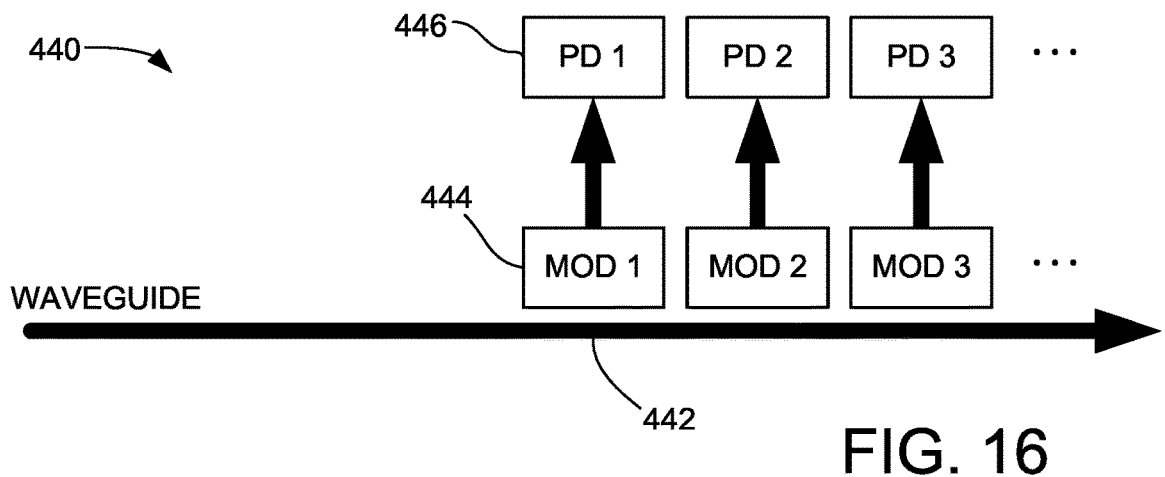
FIG. 16 shows another optical transport system in further embodiments.

FIG. 16 is a generalized functional block representation of an optical data transport system 440 in further embodiments. Analog domain multi-component signals are generated and transferred along waveguide 442. A series of adjacent modulation circuits 444, denoted as MOD 1 through MOD 3 and which can take the form of MRRs and/or MZMs, are arranged in series or parallel to extract different components from the waveguide 442 and forward the same to respective photo detectors 446 (PD 1 through PD 3). It will be appreciated that MRRs will be implemented via adjacent rings, and that MZMs will be implemented using splitters and arranged in series with the waveguide as described above.

Figure 17:
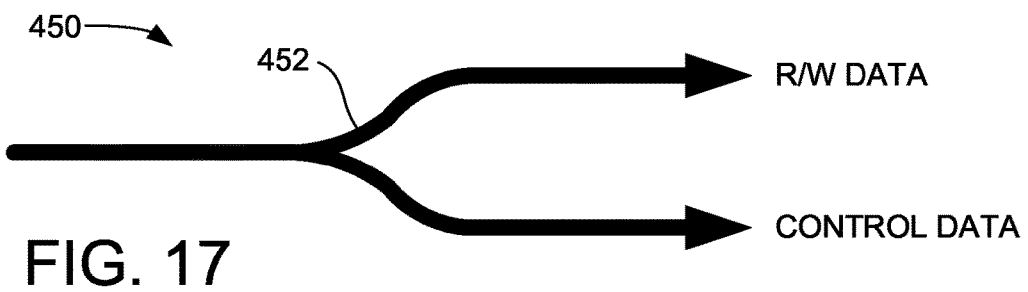
FIG. 17 shows another optical transport system in further embodiments.

FIG. 17 shows another representation of an optical data transport system 450 in further embodiments. The system incorporates an optical splitter 452 to enable separate decoding of read/write (R/W) data and associated control data signals from the same transmission. Without limitation, the control data can be preamp configuration settings (gain, encoding, etc.) used during the generation and processing of the R/W signals (or other sensor signals) which pertain to the actual data being transferred to or from the NVM.

Figure 18:
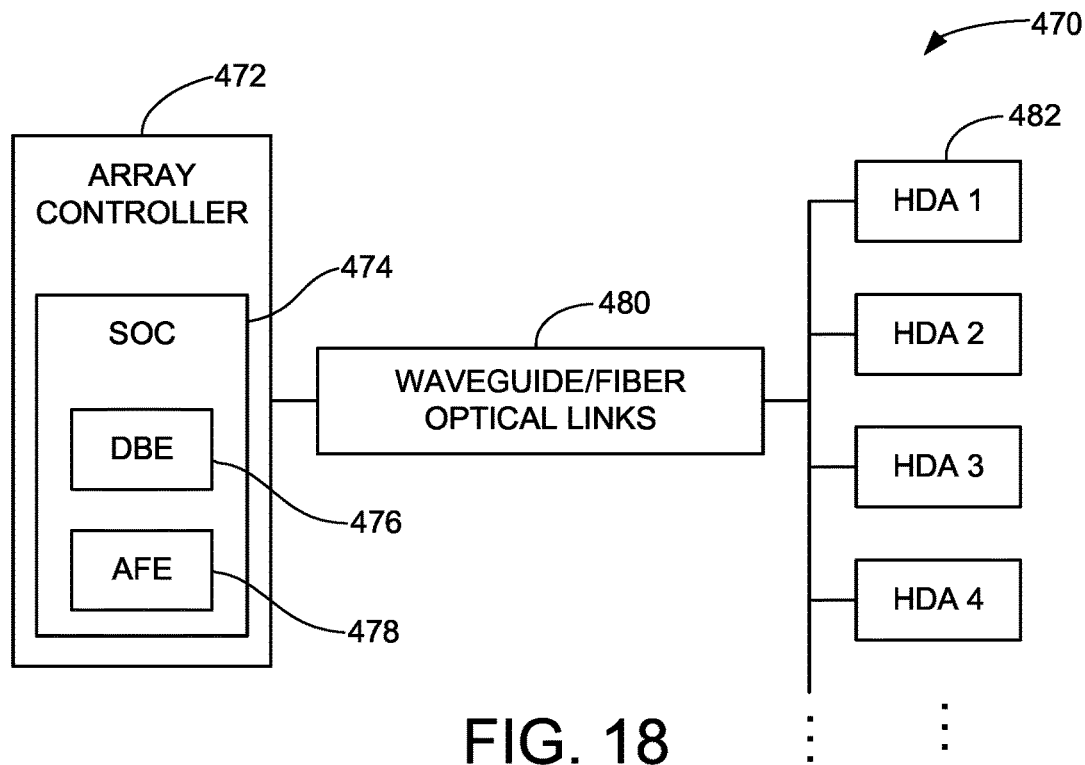
FIG. 18 is a functional block representation of a multi-device array constructed and operated in accordance with further embodiments.

While single device embodiments have been illustrated thus far, the optical links disclosed and embodied herein can be extended to a multi-device array 470, such as illustrated in FIG. 18. The array 470 includes an array controller 472 with an SOC 474 similar to those discussed above. The SOC 474 includes a DBE 476 and an AFE 478.

A set of waveguide/fiber optical links 480 configured and operated as described above are used to optically couple the AFE 478 to a number of HDAs 482 (denoted as HDA 1-4). Any number of HDAs can be incorporated into the array 470 under the central control of the SOC 474. Each HDA 482 takes a form as described above for the respective storage devices 102, 110, 160, 200, and generally operates as a storage device with the control electronics consolidated into the array controller. Hence, each HDA 482 may incorporate one or more local preamps mounted to the sides of the respective actuators. Alternatively, some or all of the preamp operations can be consolidated into the AFE 478.

Figure 19:
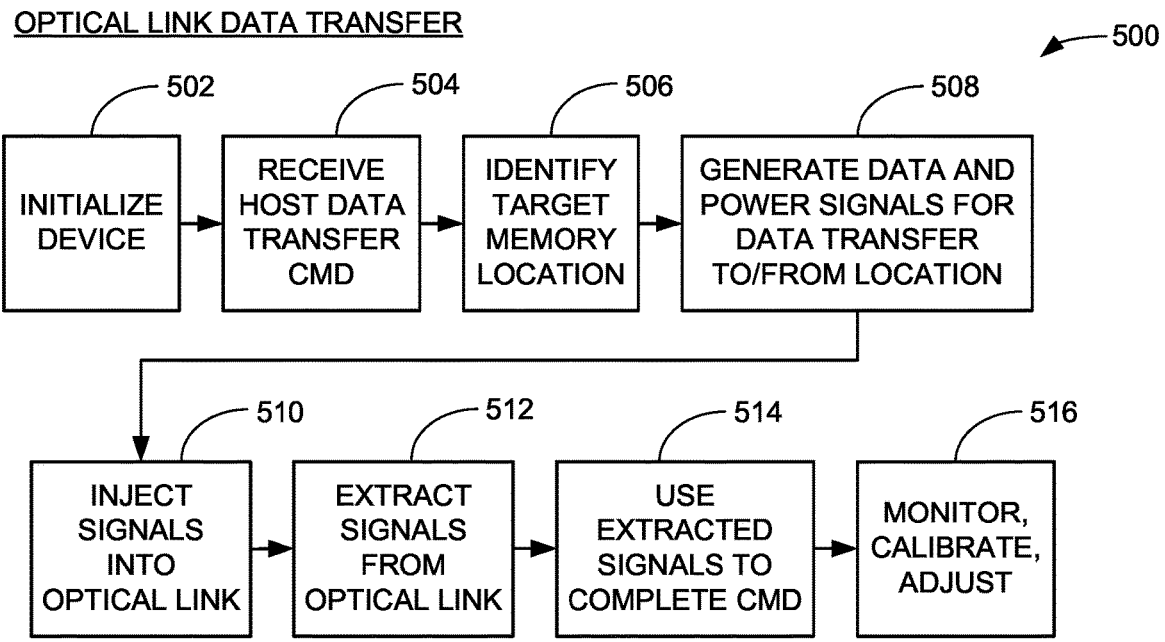
FIG. 19 is a flow diagram for an optical link data transfer sequence to illustrate operation of various embodiments.

FIG. 19 provides a flow diagram for an optical link data transfer sequence 500 carried out in accordance with the foregoing discussion. It will be understood that the sequence 500 generally describes various operations performed by the various storage devices to process and execute a data transfer command from a host device (e.g., 104, FIG. 1). It will be appreciated that additional or alternative steps may be carried out depending on the requirements of a given application.

The device is initialized at block 502 to place the device in an operationally ready state. At block 504, a host data transfer command is received and processed (such as via interface 106, FIG. 1). The data transfer command generally requests a transfer of user data between the requesting host and the main memory store of the storage device, such as in the case of a write or read command. Other types of commands are contemplated, however (e.g., erase, trim, status, allocation, etc.).

A target memory location in the main memory store is identified at block 506. In a rotatable media environment, this may include identification of a particular head/disc combination, as well as other address information (e.g., cylinder, volume, zone, track, sector, etc.). The command is placed in an appropriate command queue pending execution.

At block 508, appropriate data, control and/or power signals are generated to execute the command. For example, to service a write command, the input write data received from the host may be subjected to various forms of processing including encoding, encryption, generation of associated metadata, etc. Parameters for heater/laser power and other related system elements maybe used to generate various power and control profiles. To service a read command, various parameters may be similarly required to prepare the system to execute the same.

When the system is ready to execute the data transfer, the generated signals from block 508 are injected into one or more of the optical links at block 510 and extracted from the optical links at block 512, as described above. The extracted signals are used at block 514 to complete the remaining processing associated with the command. For example, a write command may involve a follow up read verify operation, the updating of map metadata, etc. A read command may involve decoding of the extracted data and transfer to the requesting host. Other post optical transfer operations can be carried out as required.

Finally, block 516 shows operation to monitor the system operation to ensure the optical link transfers are occurring at acceptable levels. Various parameters can be utilized such as BER, syndrome counts, throughput, and so on. Calibration routines and adaptive adjustments can be made as required.

Figure 20:
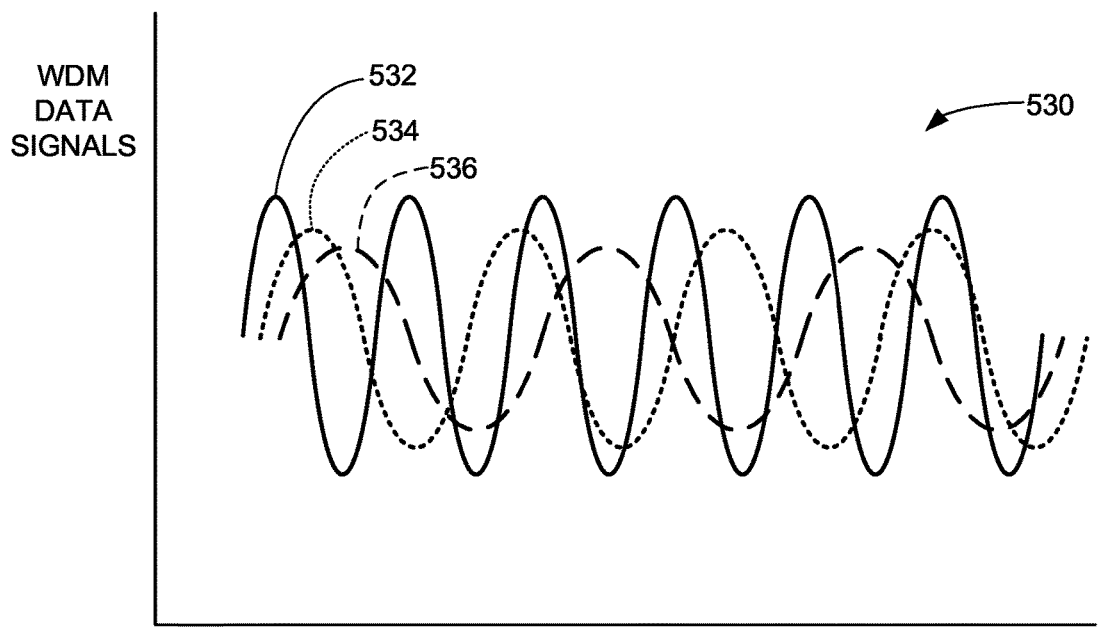
FIG. 20 graphically illustrates waveform division multiplexed (WDM) data signals generated and used by the sequence of FIG. 19 in some embodiments.

FIG. 20 graphically represents a set of wavelength division multiplexed (WDM) data signals 530 that can be processed using the optical links disclosed herein. The signals are represented as simple sinusoids for ease of illustration and include different combined waveforms 532, 534 and 536. Each of the waveforms can be provided with different characteristics, such as frequency/wavelength, amplitude, etc. to facilitate concurrent transfer and multiplexed extraction at the appropriate site. As noted above, the respective waveforms are separate components of the composite analog signal and can take any of the various forms described above including but not limited to data write signals, data read signals, sensor signals, control signals, power signals, etc.

It will now be understood that the various embodiments presented herein can present a number of benefits over the existing art. The optical transmission of analog signals can efficiently and effectively provide high bandwidth, low power and high frequency data transfers in a multiplexed data processing environment. Efficient power and control signal transfers can also be carried out.

While the various embodiments illustrated herein have been directed to systems having magnetic recording media (e.g., HDDs, hybrid devices, etc.), it will be appreciated that this is not necessarily limiting. Rather, the various optical links can be used for other storage device applications, including solid-state drives (SSDs) and other memory configurations, as well as non-data storage device based applications.

Moreover, the flexible nature of the flex circuit waveguides advantageously facilitates high speed data, signal and power transfers to a moveable target/source (e.g., actuator), it will be appreciated that both ends of the optical link can instead be stationary relative one to the other. Hence, at least some embodiments do not require at least a portion of the optical path to have a flexible waveguide such as in the various flex circuits described herein.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
    transmitting an analog domain signal between an analog front end (AFE) of a data storage device controller circuit (SOC) and a preamplifier/driver circuit (preamp) using an optical link comprising a first waveguide and a second waveguide coupled to a modulation element;
    modulating the modulation element at a selected edge-of-resonance wavelength to transfer a selected component of the analog domain signal from the first waveguide to a second waveguide; and
    processing the selected component from the second waveguide to transfer data between a non-volatile memory (NVM) associated with the preamp and a local memory associated with the SOC.

2. The method of claim 1, wherein the modulation element comprises a micro-resonance ring (MRR).

3. The method of claim 2, wherein a first MRR is disposed at a first end of the first waveguide to inject the selected component into the analog domain signal and a second MRR is disposed at an opposing second end of the first waveguide to extract the selected component, the first and second MRRs modulated at the same selected edge-of-resonance wavelength.

4. The method of claim 1, wherein the modulation element comprises a Mach-Zehnder Interferometer Modulation (MZM) device.

5. The method of claim 1, wherein the selected edge-of-resonance wavelength corresponds to a transition zone for the modulation element between a minimum gain and a maximum gain.

6. The method of claim 1, wherein a flex circuit supports the preamp and a printed circuit board (PCB) supports the SOC, wherein the first and second waveguides are incorporated into a selected one of the flex circuit or the PCB, the flex circuit incorporated into a head-stack assembly (HSA) comprising a rotary actuator which supports the preamp and an array of data transducing heads adjacent a corresponding stack of rotatable magnetic recording media of the NVM.

7. The method of claim 1, wherein the selected component comprises sensor signals from a sensor adjacent a data transducer supported adjacent a rotatable data recording medium of the NVM.

8. The method of claim 1, wherein the selected component comprises write currents applied to a write driver circuit of the preamp which in turn drives a write coil adjacent a rotatable data recording medium of the NVM.

9. The method of claim 1, wherein the selected component comprises read signals detected from magnetic flux transitions of a rotatable data recording medium of the NVM.

10. The method of claim 1, wherein the selected component comprises a power control signal forwarded to a heater element or a laser diode of a data transducer adjacent a rotatable data recording medium of the NVM.

11. The method of claim 1, further comprising applying the selected component to a photo detector circuit to convert the selected component to electrical analog form, and applying the converted selected component in electrical analog form to an analog-to-digital converter (ADC) to convert the selected component to an electrical digital form.

12. The method of claim 1, wherein the optical link comprises a first extent of rigid waveguide incorporated into a printed circuit board (PCB) which supports the SOC, a second extent of flexible waveguide incorporated into a flex circuit of a rotary actuator that supports the preamp, and an intervening bulkhead connector with which the respective PCB and flex circuit mate, the bulkhead connector extending through a base deck of a head-disc assembly (HDA) which houses the flex circuit and the rotary actuator.

13. A data storage device, comprising:
    a non-volatile memory (NVM) comprising a rotatable magnetic recording disc;
    a data transducer adjacent a recording surface of the disc;
    an optical link extending between a preamplifier/driver circuit (preamp) associated with the NVM and a controller circuit (SOC), the optical link comprising a first waveguide, a second waveguide and an intervening modulation element; and
    a control circuit which transfers an analog domain signal between the SOC and the preamp to write data to or read data from the disc using the data transducer, the control circuit extracting a selected component from the analog domain signal associated with the data transducer by modulating the modulation element at an edge-of-resonance wavelength.

14. The data storage device of claim 13, wherein the modulation element comprises at least a selected one of an MRR or an MZM.

15. The data storage device of claim 13, wherein the selected component is a selected one of a write signal comprising write currents that are applied to a write coil of the data transducer to write data to the disc, a read signal comprising pulses detected by a read sensor of the data transducer to read data from the disc, or a sense signal comprising pulses detected by a sensor associated with the data transducer indicative of a relative proximity of the data transducer to the disc.

16. The data storage device of claim 13, wherein the selected component is a power control signal applied to a heater or laser diode of the data transducer.

17. The data storage device of claim 13, further comprising a rotary actuator mounted to an interior surface of a base deck and configured to controllably position the data transducer adjacent the data recording medium, the rotary actuator interconnected, via a flex circuit, to an external printed circuit board assembly (PCBA) mounted to an external surface of the base deck using a bulkhead connector that extends through an aperture of the base deck, wherein the optical link comprises a rigid waveguide portion incorporated into the PCBA and a flexible waveguide portion incorporated into the flex circuit.

18. The data storage device of claim 14, wherein the MRR is a first MRR coupled adjacent a first end of the first waveguide, and wherein the data storage device comprises a second MRR coupled adjacent a second end of the first waveguide configured to be selectively modulated to inject the selected component into the first waveguide.

19. The data storage device of claim 18, wherein the first and second MRRs comprise a first MRR set configured to transfer signals used by the data transducer, and wherein the data storage device further comprises a second MRR set having different modulation characteristics as compared to the first MRR set to transfer a second selected component of the analog domain signal associated with a second transducer between the AFE and the preamp.

20. The data storage device of claim 18, characterized as a multi-device array of a data archival system, wherein the AFE is disposed in a central controller and the NVM and data transducer are in a first head-disc assembly (HDA) of a plurality of nominally identical HDAs coupled to the central controller via corresponding optical links.

* * * * *